(12) United States Patent
Nam

(10) Patent No.: US 10,900,141 B2
(45) Date of Patent: Jan. 26, 2021

(54) HEATER FOR INGOT GROWING APPARATUS

(71) Applicant: WOONGJIN ENERGY CO., LTD., Daejeon (KR)

(72) Inventor: Woo Seok Nam, Daejeon (KR)

(73) Assignee: WOONGJIN ENERGY CO., LTD., Daejeon (KR)

(*) Notice: Subject to any disclaimer, the term of this patent is extended or adjusted under 35 U.S.C. 154(b) by 146 days.

(21) Appl. No.: 16/306,110

(22) PCT Filed: Feb. 21, 2017

(86) PCT No.: PCT/KR2017/001877
§ 371 (c)(1),
(2) Date: Dec. 26, 2018

(87) PCT Pub. No.: WO2017/209375
PCT Pub. Date: Dec. 7, 2017

(65) Prior Publication Data
US 2019/0177875 A1    Jun. 13, 2019

(30) Foreign Application Priority Data
May 30, 2016   (KR) .................... 10-2016-0066772

(51) Int. Cl.
*H05B 6/32* (2006.01)
*C30B 15/14* (2006.01)
(Continued)

(52) U.S. Cl.
CPC ............. *C30B 15/14* (2013.01); *C30B 29/06* (2013.01); *C30B 35/00* (2013.01)

(58) Field of Classification Search
CPC ......... C30B 15/00; C30B 15/12; C30B 15/14; C30B 29/06; C30B 35/00
(Continued)

(56) References Cited

U.S. PATENT DOCUMENTS 3,860,736 A  *  1/1975  Ford ................ C30B 15/14
                                                373/134
4,606,037 A  *  8/1986  Terashima ........ C30B 15/305
                                                373/109

FOREIGN PATENT DOCUMENTS

JP      11-139898 A  *  5/1999
JP      H11-139895       5/1999
(Continued)

OTHER PUBLICATIONS

International Search Report and Written Opinion issued in International Patent Application No. PCT/KR2017/001877, dated Jun. 20, 2017.

*Primary Examiner* — Hung D Nguyen
(74) *Attorney, Agent, or Firm* — Norton Rose Fulbright US LLP

(57) ABSTRACT

A heater for an ingot growing apparatus is provided. The heater, disposed outside a crucible so as to heat the crucible, for an ingot growing apparatus comprises: a body part including a flow path through which a heat source, for generating heat for heating the crucible, flows; and a heat increasing part formed by being inwardly cut at a predetermined depth along a circumferential direction at an upper side of the body part, wherein a portion of the body part, at which the heat increasing part is formed, has a thickness (d3) formed to be less than a thickness (d2) of the other portion of the body part such that the heat can be intensively generated at the heat increasing part.

9 Claims, 8 Drawing Sheets

(51) Int. Cl.
*C30B 29/06* (2006.01)
*C30B 35/00* (2006.01)
*F27B 14/00* (2006.01)

(58) Field of Classification Search
USPC ......... 373/27, 30, 36, 39, 41, 109, 113, 117, 373/125, 127, 128, 129, 130, 134; 219/390, 420, 422, 424, 426, 535, 536, 219/539, 541, 552, 553; 117/118, 200, 117/201, 202, 208, 217, 218, 219, 222
See application file for complete search history.

(56) References Cited

FOREIGN PATENT DOCUMENTS

| | | |
|---|---|---|
| KR | 2001-0052460 | 6/2001 |
| KR | 10-1048831 | 7/2011 |
| KR | 10-1083503 | 11/2011 |
| KR | 2005-0064244 | 1/2012 |
| KR | 2012-0098162 | 9/2012 |

* cited by examiner

HEATER FOR INGOT GROWING APPARATUS

CROSS-REFERENCE TO RELATED APPLICATIONS

This application is a national phase application under 35 U.S.C. § 371 of International Application No. PCT/KR2017/001877, filed Feb. 21, 2017, which claims priority to and the benefit of Korean Patent Application No. 10-2016-0066772, filed May 30, 2016. The contents of the referenced patent applications are incorporated into the present application by reference.

FIELD OF THE DISCLOSURE

The present invention relates to a heater for an ingot growing apparatus.

DESCRIPTION OF RELATED ART

Generally, a single crystal ingot is manufactured by the Czochralski crystal growing method (CZ method). More specifically, a melt is made by filling a solid raw material such as polysilicon or the like in a crucible installed in a hot zone area and heating and melting the raw material by a heater, and then a single crystal seed is gradually rotated and pulled up after hanging on a seed connector and coming into contact with the melt. Accordingly, a neck part, a shoulder part whose diameter increases, and a body part having a cylindrical shape whose diameter is uniform are pulled up in order in the seed connector, and a single crystal ingot having a tail part whose diameter decreases as an end thereof is obtained.

Further, the heater configured to melt the silicon is installed adjacent to an outer surface of the crucible. That is, the heater is manufactured in a cylindrical shape to entirely surround the outer surface of the crucible and is installed to surround the outside of the crucible.

In this case, the heater is generally and mainly made of graphite, and an electric current flows by connecting a power supply to the graphite, and in this case, the crucible is configured to operate as the heater due to resistance heat of the graphite.

Further, the crucible is heated by heat from the heater. In this case, oxygen is generated due to material characteristics of the crucible when the crucible is heated by high-temperature heat, and generation of the oxygen is a factor that can hinder growth of the ingot.

Further, the heater has a structure in which heat generated at a lower side of the heater is greater than heat generated at an upper side of the heater, and a large amount of heat generated at the lower side of the heater is concentrated at a lower side of the crucible.

More specifically, the heat is concentrated at a portion connected to a side surface of the crucible at a lower surface of the crucible. When the heat from the heater is concentrated at the portion connected to the side surface of the crucible at the lower surface of the crucible, more oxygen is generated in the crucible. Further, the generated oxygen moves to a growth location of the ingot along a convection of the melted raw material in the crucible.

Accordingly, the oxygen is mixed with the melted raw material in the crucible, and introduced into the ingot when the ingot grows. That is, the ingot grows with impurities.

Further, since a large amount of heat of the crucible is largely discharged to the outside through the lower side of the crucible, much of the heat is generated in the crucible but is also mostly discharged to the outside.

SUMMARY OF THE INVENTION

The present invention is directed to providing a heater for an ingot growing apparatus capable of intensively transferring heat to a side surface of a crucible.

One aspect of the present invention provides a heater for an ingot growing apparatus disposed at the outside of a crucible to heat the crucible including: a body part including a flow path through which a heat source configured to generate heat which heats the crucible flows; and a heat increasing part formed to be inwardly cut at a predetermined depth along a circumferential direction at an upper side of the body part, wherein a portion of the body part at which the heat increasing part is formed has a thickness (d3) smaller than a thickness (d2) of the other portion of the body part and thus the heat is intensively generated at the heat increasing part.

Further, a depth (d1) of the heat increasing part may be formed to be 10 to 20% of the thickness (d2) of the body part.

In addition, a height of the heat increasing part may be formed to be 90 to 100 mm.

In addition, the heat increasing part may be spaced 100 to 120 mm apart from an upper end of the body part and formed at the periphery of the body part.

In addition, the body part may include a plurality of first slits configured to downwardly extend from an upper end of the body part and a plurality of second slits configured to upwardly extend from a lower end of the body part, and the flow path may be formed by alternating the plurality of first slits and the plurality of second slits at a predetermined interval.

In addition, a height (h1) which is from one end of the first slit to a lower end of the body part may be formed to be greater than a height (h2) which is from one end of the second slit to an upper end of the body part to reduce generation of the heat.

In addition, a height (h3) of a portion in which the first slit and the second slit overlap each other may correspond to a height of a sidewall of the crucible.

In addition, a plurality of insulation parts configured to prevent discharge of heat from the crucible to the outside may inwardly extend from a lower end portion of the body part.

In addition, the insulation parts may be screw-coupled to the lower end portion of the body part.

In addition, one side of each of the insulation parts may be formed to have a thickness of 20 mm to be coupled to the lower end portion of the body part, and the other side of each of the insulation parts may be formed to have a thickness of 10 mm.

According to the present invention, since a heat increasing part is formed at an upper side of a body part so that heat can be concentrated at a sidewall of a crucible, an oxygen generation amount in the crucible can be significantly reduced.

Further, since the oxygen generation amount in the crucible is reduced, an ingot can grow without including impurities.

In addition, since an insulation part is installed at a lower end portion of the body part to prevent discharge of heat from a lower side of the crucible to the outside, heat in the crucible can easily move in an upward direction and heat consumption can be reduced.

DETAILED DESCRIPTION OF THE INVENTION

Figure 1:
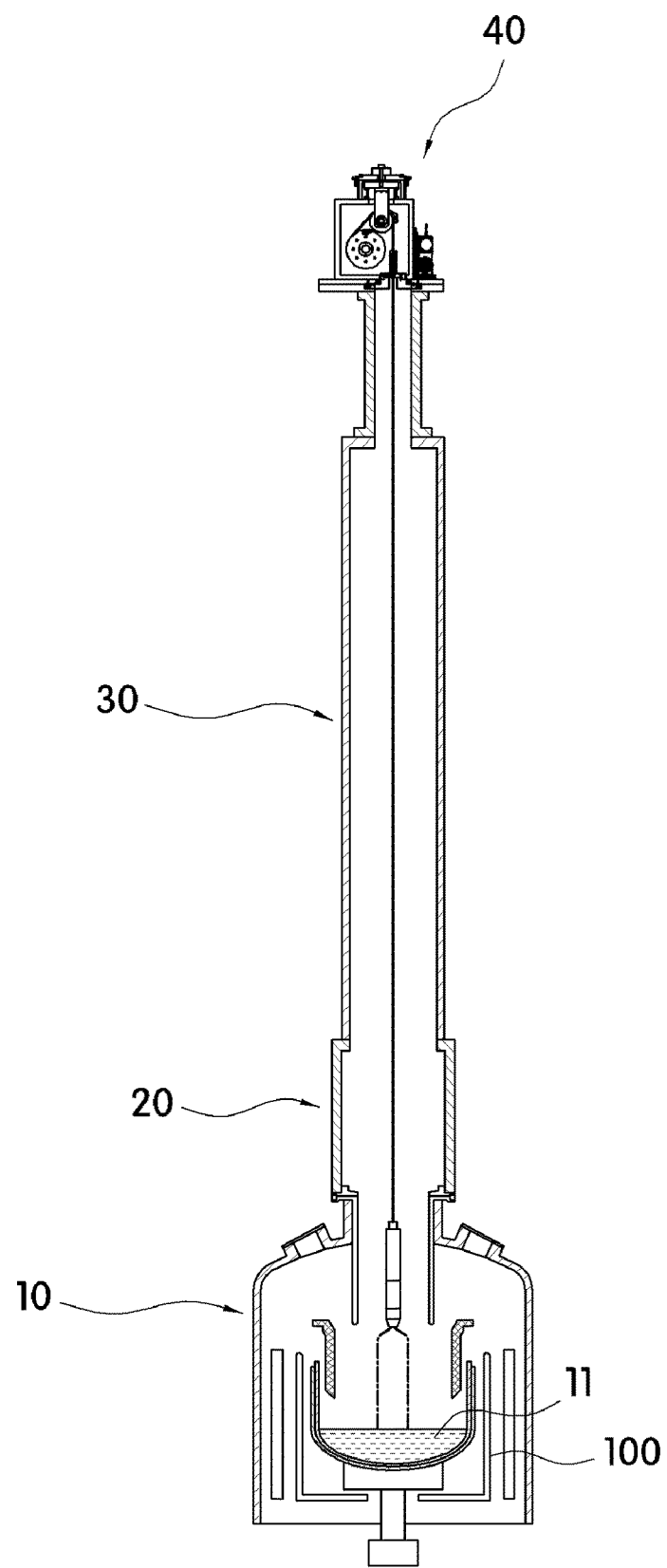
FIG. 1 is a view schematically illustrating an ingot growing apparatus in which a heater is mounted according to an embodiment of the present invention.

Hereinafter, an exemplary embodiment of the present invention will be described in detail with reference to the accompanying drawings which may allow one of ordinary skill in the art to easily perform the present invention. The present invention may be implemented in various forms and is not limited to the following embodiment. Components not related to the description are omitted in the drawings to clearly describe the present invention, and the same reference symbols are used for the same or similar components in the description.

Referring to FIG. 1, an ingot growing apparatus 1 in which a heater according to an embodiment of the present invention is installed includes a base (not shown), a main chamber 10, a dome chamber 20, a pull chamber 30, and a driving part 40.

The base (not shown) is a configuration installed on a bottom surface on which the ingot growing apparatus 1 is placed to support the ingot growing apparatus. The base 10 may have a shape in which plurality of frames are coupled.

The main chamber 10 may be formed in a cylindrical shape. A crucible 11 configured to accommodate a raw material and a heater 100 configured to heat the crucible 11 to melt the raw material may be installed in the main chamber 10.

The dome chamber 20 is installed above the crucible 11. The dome chamber 20 may have a lower portion formed in a dome shape and a dome-shaped upper portion may be formed in a cylindrical shape. A cooling device (not shown) configured to cool the ingot which grows in the crucible 11 may be installed in the dome chamber 20. The cooling device may be formed so that cooling water may circulate in the cooling device.

The pull chamber 30 is formed on the dome chamber 20. The pull chamber 30 may be formed in a pipe shape which extends in an upward direction, and the inside of the pull chamber 30 serves as a path through which the ingot may pass.

The heater 100 installed in the main chamber 10 heats the crucible 11 to melt the raw material in the crucible 11.

Figure 2:
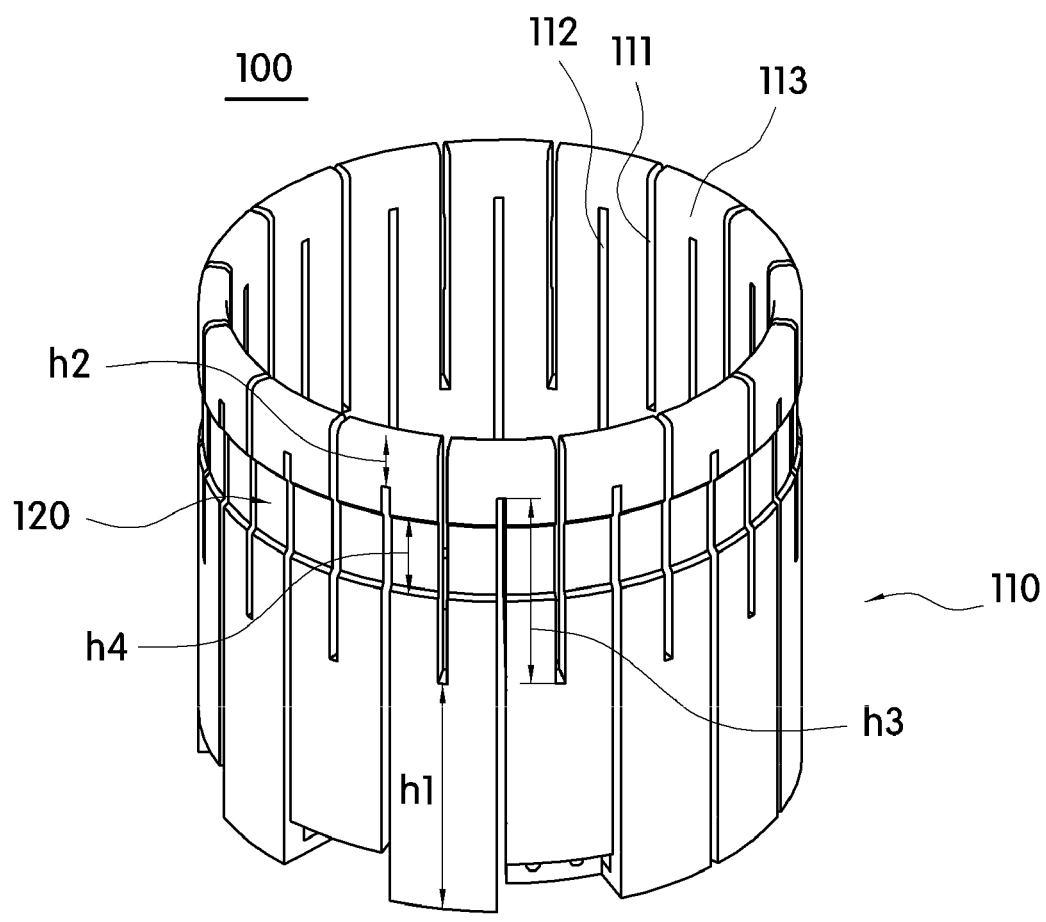
FIG. 2 is a perspective view illustrating the heater for an ingot growing apparatus according to the embodiment of the present invention.

As shown in FIG. 2, the heater 100 may include a body part 110 and a heat increasing part 120.

The body part 110 may be disposed in a cylindrical shape to surround an outer circumferential surface of the crucible 11. In this case, the body part 110 may extend from an upper portion of the crucible 11 to a bottom surface of the main chamber 10.

Further, the body part 110 may include first slits 111, second slits 112 and flow paths 113.

The first slit 111 may downwardly extend from an upper end of the body part 110, and a plurality of first slits 111 may be formed at predetermined intervals along the periphery of the body part 110.

Further, the second slit 112 may upwardly extend from a lower end of the body part 110, and a plurality of second slits 112 may be formed at predetermined intervals along the periphery of the body part 110.

In this case, the plurality of first slits 111 and the plurality of second slits 112 are alternately formed to form the flow paths 113 through which an electric current flows.

That is, the electric current moves between the first slits 111 and the second slits 112. Here, the body part 110 may be mainly made of graphite, and when a power supply is connected to the graphite, the electric current flows to the graphite. Further, the electric current which flows to the graphite generates heat by flowing between the first slits 111 and the second slits 112. In this case, the generated heat heats the crucible 11 to melt the raw material.

Meanwhile, since the first slits 111 and the second slits 112 are alternately formed, some of the first slits 111 and the second slits 112 are disposed to overlap each other. Further, a height (h3) of each of portions at which the first slits 111 and the second slits 112 overlap each other may be greater than or equal to a height of a sidewall of the crucible 11.

That is, the electric current which flows through the flow path 113 generates a large amount of heat by passing through portions in which the first slits 111 and the second slits 112 overlap each other. Further, since the height (h3) of each of portions at which the first slits 111 and the second slits 112 overlap each other is formed to correspond to the height of the sidewall of the crucible 11, the heat generated by the electric current which flows through the first slits 111 and the second slits 112 is transferred to the sidewall of the crucible 11.

In addition, a height (h1) from one end of each of the first slits 111 to a lower end of the body part 110 may be formed to be greater than a height (h2) from one end of each of the second slits 112 to an upper end of the body part 110.

Accordingly, heat transferred to a lower side of the crucible 11 is transferred at a lower temperature than that of heat transferred to an upper side of the crucible 11.

More specifically, since the height (h1) from one end of each of the first slits 111 to the lower end of the body part 110 is formed to be greater than that of the height (h2) from one end of each of the second slits 112 to the upper end of the body part 110, the electric current which flows along the flow path 113 may flow more smoothly at the height (h1)

than the height (h2). Accordingly, the heat generated by the electric current may be generated less at the height (h1) than the height (h2), and accordingly, the heat transferred to the lower side of the crucible is less than the heat at the upper side of the crucible.

Meanwhile, the heat increasing part 120 may be formed at the periphery of the body part 110. The heat increasing part 120 may transfer more heat to a side surface of the crucible 11.

The heat increasing part 120 may be inwardly cut at a predetermined depth along the periphery of the body part 110.

Figure 3:
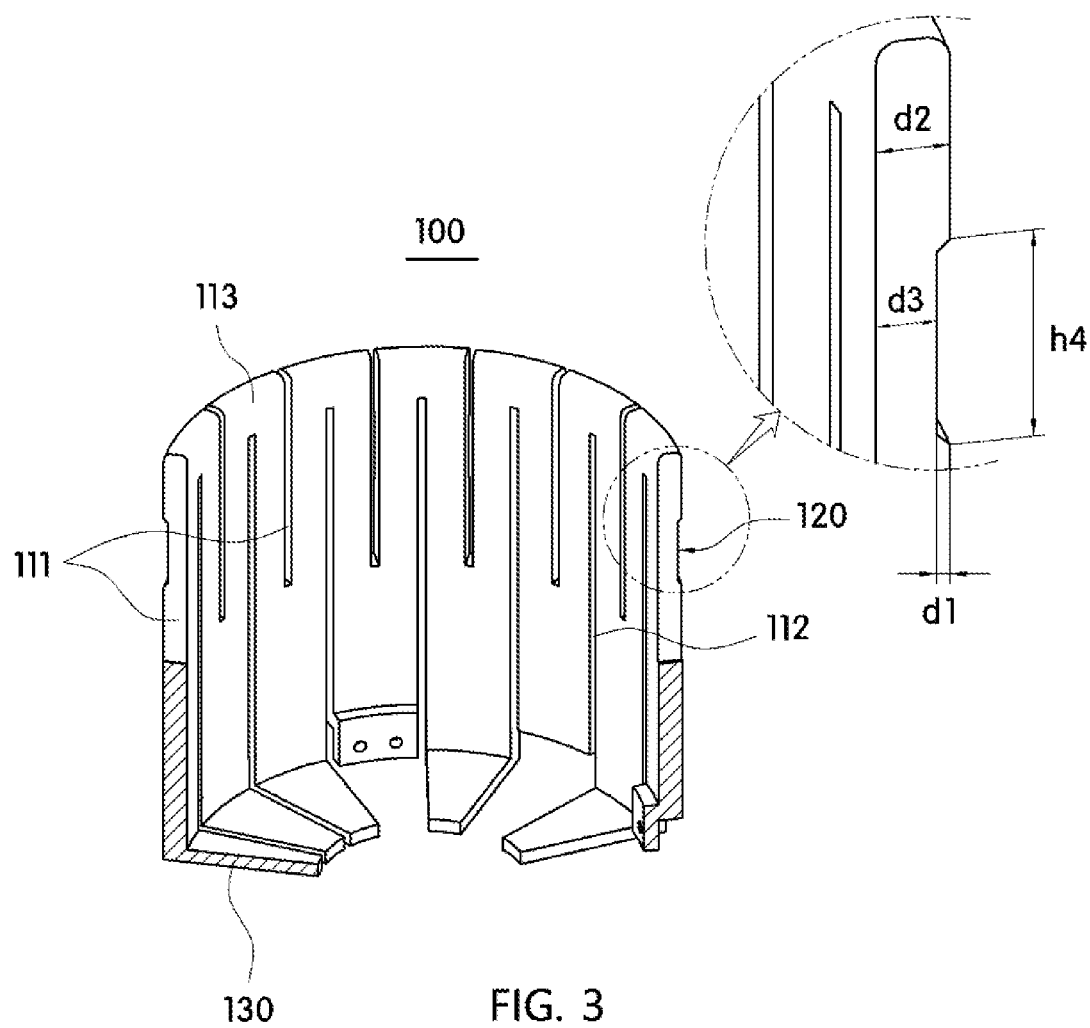
FIG. 3 is a cross-sectional perspective view of the heater for an ingot growing apparatus according to the embodiment of the present invention.

In this case, referring to FIG. 3, a depth (d1) of the heat increasing part 120 should be formed so that heat may be concentrated at the sidewall of the crucible and influence on corrosion of the body part 110 is not given. Specifically, the depth (d1) of the heat increasing part 120 may be formed to be 10 to 20% of the total thickness of the body part 110, and more specifically, may be formed to be 16.5 to 18% of the total thickness of the body part 110.

As an example, when a thickness (d2) of the body part 110 is 100 mm, the depth (d1) of the heat increasing part 120 may be formed to be 16 to 18 mm.

Here, when the depth of the heat increasing part 120 is 10 to 15% of the total thickness of the body part 110, a heat generation amount is small, and when the depth of the heat increasing part 120 is 18.1 to 20%, heat concentration may be high but an influence such as corrosion of the body part 110 may be given. Further, when the depth of the heat increasing part 120 is greater than or equal to 20% of the total thickness of the body part 110, while heat generation is locally stronger, since an adverse effect in which heat generation between the first slits 111 and the second slits 112 becomes weak may occur and efficiency of a whole heater may decrease, it is preferable that the depth (d1) of the heat increasing part 120 is formed to be 16.5 to 18% of the total thickness of the body part 110.

Accordingly, a thickness (d3) of a portion of the body part 110 at which the heat increasing part 120 is formed is smaller than the thickness (d2) of another portion of the body part 110. That is, a width of the flow path 113 decreases at the heat increasing part 120. Accordingly, the electric current which moves along the flow path 113 may not smoothly move through the heat increasing part 120 compared to the flow path 113 of other portions, and accordingly, heat is generated most at the heat increasing part 120.

Accordingly, the heat generated at the heat increasing part 120 intensively heats the side surface of the crucible 11, and the temperature of the sidewall of the crucible 11 increases.

Further, a height h4 of the heat increasing part 120 may be formed to be 90 to 100 mm, and a location in which the heat increasing part 120 is formed at an outer circumferential surface of the body part 110 may be formed to be spaced 100 to 120 mm apart from the upper end of the body part 110. Further, the above-described location is a location in which the heat may be concentrated at the sidewall of the crucible 11.

Meanwhile, although the heat generated at the body part 110 is transferred to the sidewall of the crucible 11, when a lower portion of the heater 100 is open, the heat from the crucible 11 is discharged to the outside through the lower portion of the heater 100 and thus heat loss of the crucible increases.

Figure 4:
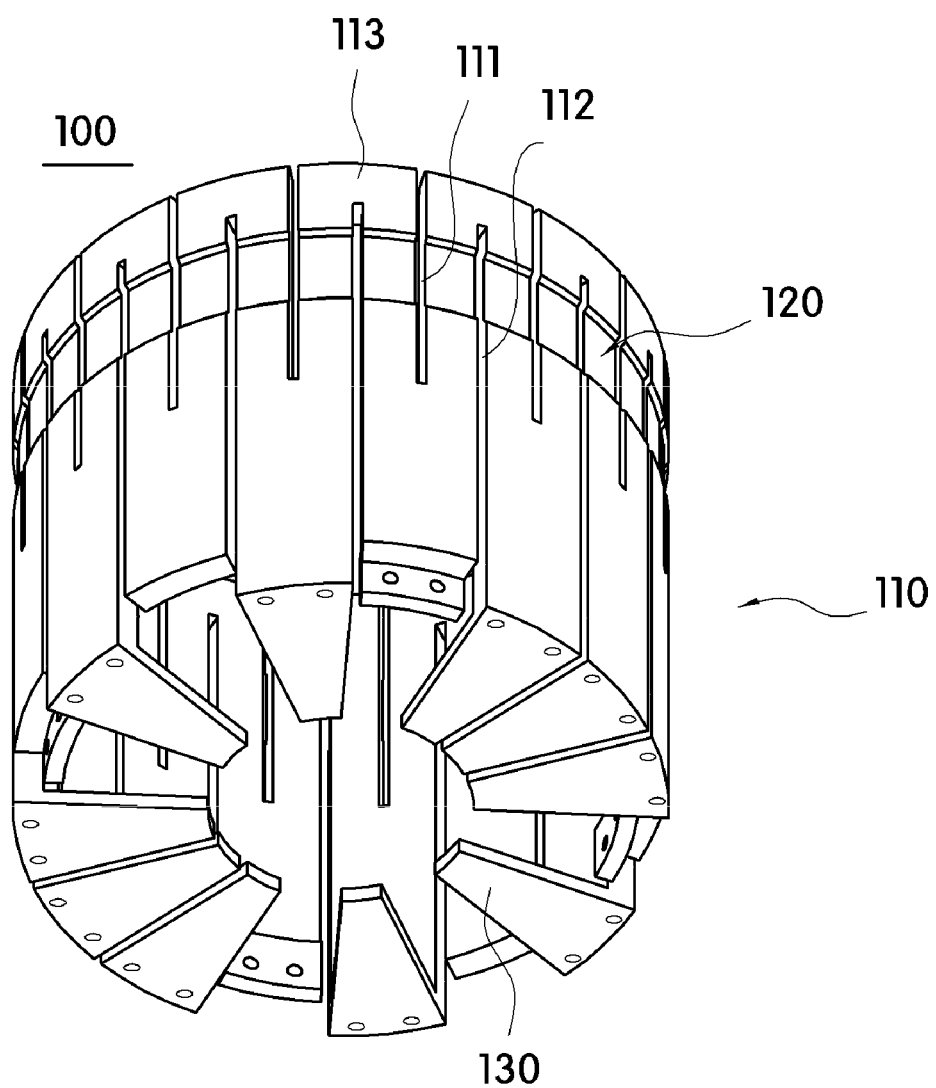
FIG. 4 is a rear perspective view from a lower portion of the heater for an ingot growing apparatus according to the embodiment of the present invention.

In order to prevent the above, referring to FIG. 4, an insulation part 130 configured to prevent discharge of the heat from the crucible 11 to the outside may be installed at the lower portion of the body part 110.

The insulation part 130 may be formed to inwardly extend from the lower end of the body part 110, and more specifically, the insulation part 130 is formed in a fan shape of which a width decreases from the lower end of the body part 110 to the inside.

Further, one side of the insulation part 130 may be coupled to a lower end portion of the body part 110, and in this case, the one side of the insulation part 130 may be screw-coupled to the lower end portion of the body part 110.

Here, the insulation part 130 is shown and described to be screw-coupled to the body part 110, but the present invention is not limited thereto. The insulation part 130 may be integrally formed with the lower end of the body part 110, and may also be coupled to the lower end of the body part 110 by methods other than a screw-coupling method.

Further, a thickness of the one side of the insulation part 130 coupled to the lower end of the body part 110 may be formed to have 20 mm, and a thickness of the other side of the insulation part 130 may be formed to have 10 mm.

In addition, a plurality of insulation parts 130 may be provided to be installed at the lower end portions of the body part 110, and may be disposed to be spaced apart from each other at predetermined intervals. Alternatively, some of the plurality of insulation parts may be continuously disposed and the remaining insulation parts may be disposed to be spaced apart from each other.

As an example, with six insulation parts among the plurality of insulation parts, three insulation parts each may be continuously installed and disposed to face each other at the lower end of the body part 110, and the remaining four insulation parts may be individually installed between the three insulation parts.

As described above, locations of the plurality of insulation parts are not limited, and the plurality of insulation parts may be disposed in any manner as long as the discharge of the heat from the crucible to the outside is prevented.

The heat temperature, heat transfer, and oxygen distribution of the crucible during operation were measured after the above-described heater 100 is installed on the outer circumferential surface of the crucible 11.

Figure 5:
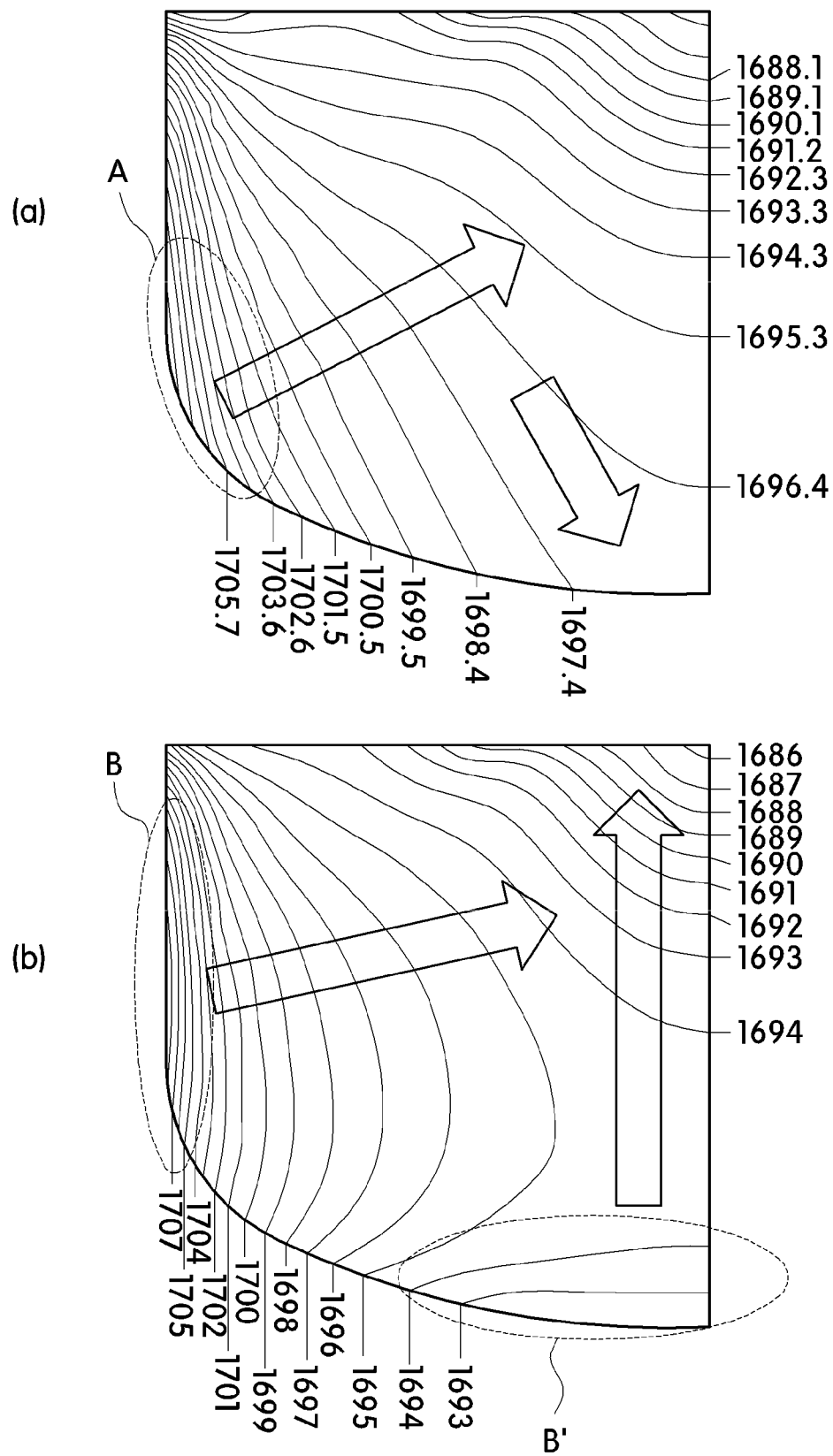
FIGS. 5 (a) and (b) are a set of test data in which a temperature of heat transferred to a crucible from each of a conventional heater and the heater according to the embodiment of the present invention is measured.

FIGS. 5 (a) and (b) are a set of test data in which a temperature of heat transferred to the crucible from each of a conventional heater and the heater according to the embodiment of the present invention is measured.

FIG. 5 (a) is a chart showing the heat distribution of a crucible using the conventional heater, and referring to part A, the heat may be concentrated at a lower portion of the crucible in the conventional heater. Accordingly, oxygen generated at a curved portion extending from a lower portion of the sidewall of the crucible to a bottom surface of the crucible moves to an ingot growing location along a convection of the melted raw material.

Accordingly, the oxygen is mixed with the melted raw material in the crucible, and the melted raw material is hardened and introduced into the ingot with the oxygen when the ingot grows.

On the other hand, FIG. 5 (b) is a chart showing the heat distribution of the crucible using the heater according to the embodiment of the present invention, the heat may be concentrated at the sidewall of the crucible, and the heat from the sidewall of the crucible may move to a center of the inside of the crucible (see part B in FIG. 5 (b)). Further, the lower portion of the crucible may have a temperature lower than that of the sidewall of the crucible (see part B' in FIG. 5 (b)).

Accordingly, the heat generated at the sidewall of the crucible may maintain a temperature capable of melting the raw material in the crucible, and it may be confirmed that a temperature of the lower side of the crucible is lowered to reduce generation of the oxygen.

Figure 6:
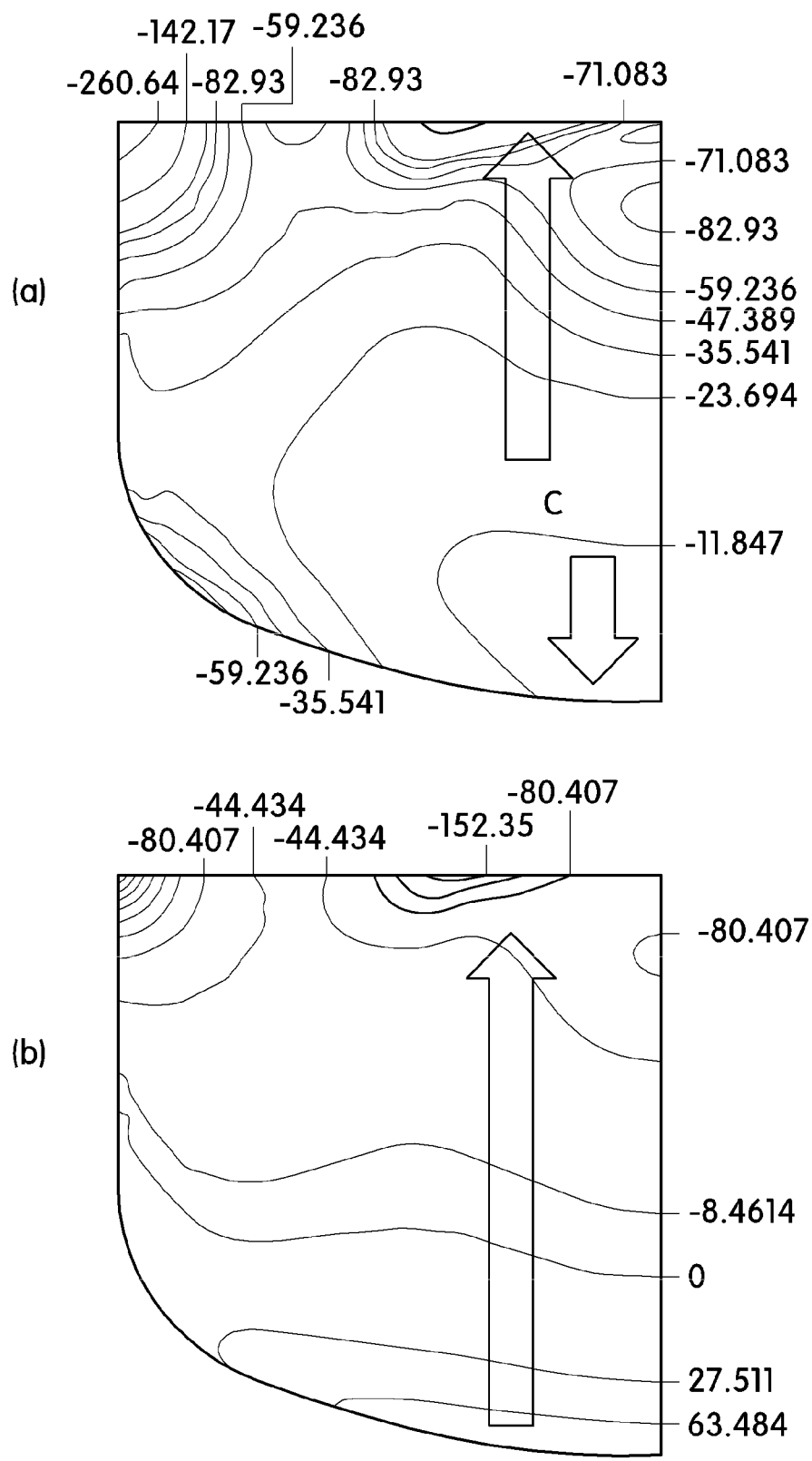
FIGS. 6 (a) and (b) are a set of test data in which a movement distribution of the heat transferred to the crucible from each of the conventional heater and the heater according to the embodiment of the present invention is measured.

FIGS. 6 (a) and (b) are a set of test data in which a movement distribution of the heat transferred to the crucible from each of the conventional heater and the heater according to the embodiment of the present invention is measured.

FIG. 6 (a) shows a heat movement distribution of the crucible using the conventional heater, the movement of the heat may generate a convection in the crucible, and the heat of the crucible may be discharged to the outside through the lower side of the crucible as shown in part C.

On the other hand, FIG. 6 (b) shows a heat movement distribution of the crucible using the heater according to the embodiment of the present invention, and since the discharge of the heat from the lower side of the crucible is prevented by the insulation part installed at the lower portion of the body part, a form in which the heat moves more horizontally when moving in an upward direction from the lower portion of the crucible may be confirmed even when the temperature of the inside of the crucible is not maintained high.

Accordingly, since an amount of the heat discharged through the lower side of the crucible is small, heat consumption is less than that of the conventional heater.

Figure 7:
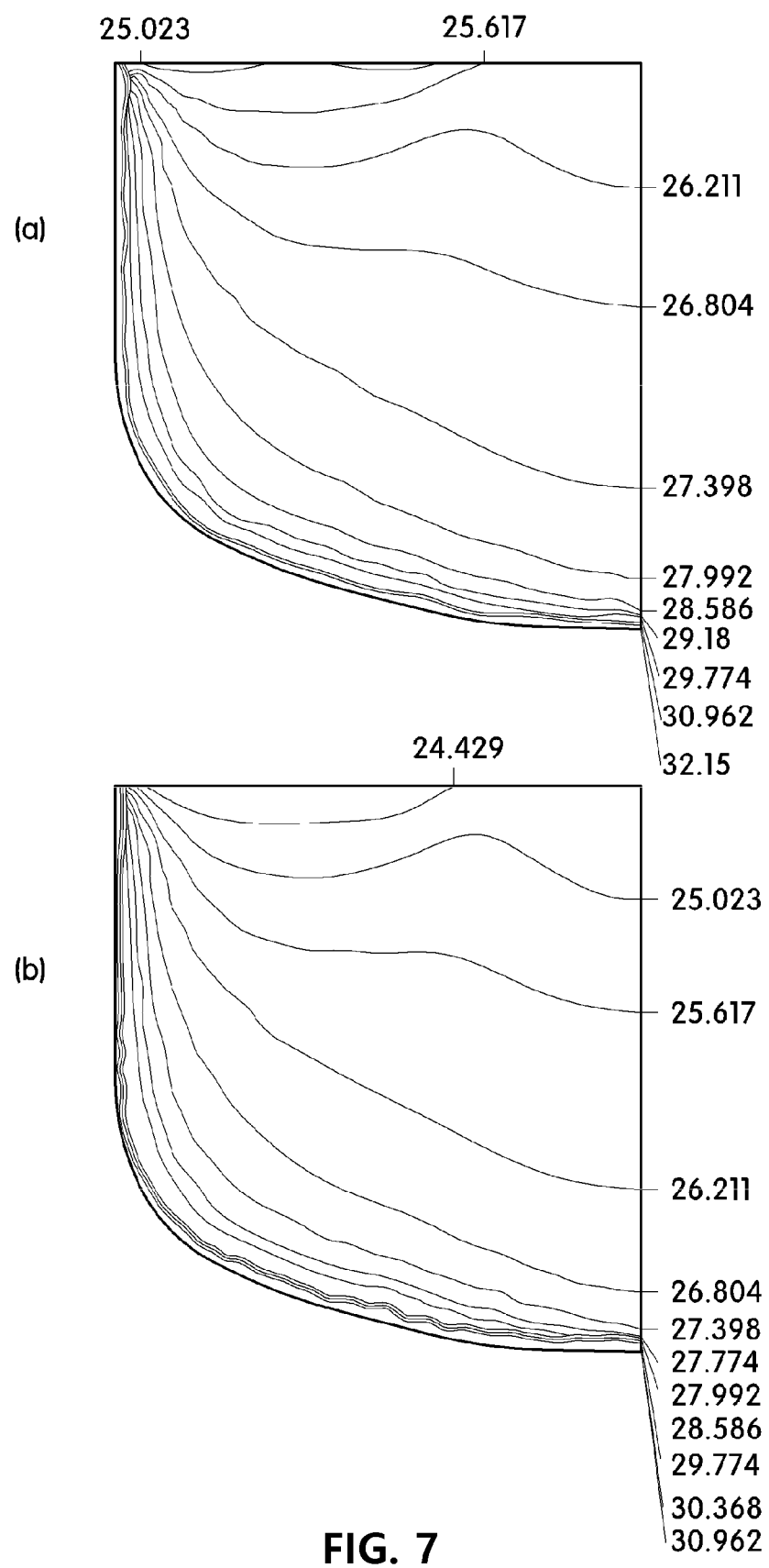
FIGS. 7 (a) and (b) are a set of test data in which a distribution of oxygen generated by heating of the crucible by the conventional heater and the heater according to the embodiment of the present invention is measured.

FIGS. 7 (a) and (b) are a set of test data in which a distribution of oxygen generated by heating of the crucible by the conventional heater and the heater according to the embodiment of the present invention is measured.

FIG. 7 (a) shows an oxygen generation distribution using the conventional heater, and it can be seen that the oxygen generation at the sidewall and the bottom surface of the crucible is 30.962 ppma, and green is distributed to a center of the crucible.

Further, it may be inferred that the ingot is grown at roughly 25.5 to 26.0 ppma.

However, FIG. 7 (b) shows an oxygen generation distribution using the heater according to the embodiment of the present invention, and it can be seen that the oxygen generation from the sidewall and the bottom surface of the crucible may be 30.368 to 29.774 ppma, the center of the inside of the crucible may show blue at roughly 25 ppma, and accordingly, the oxygen generated inside the crucible is significantly lower than that of the conventional heater when the heater of the present invention is used.

Further, it may be inferred that the ingot is grown at roughly 24.43 to 25.023 ppma.

Figure 8:
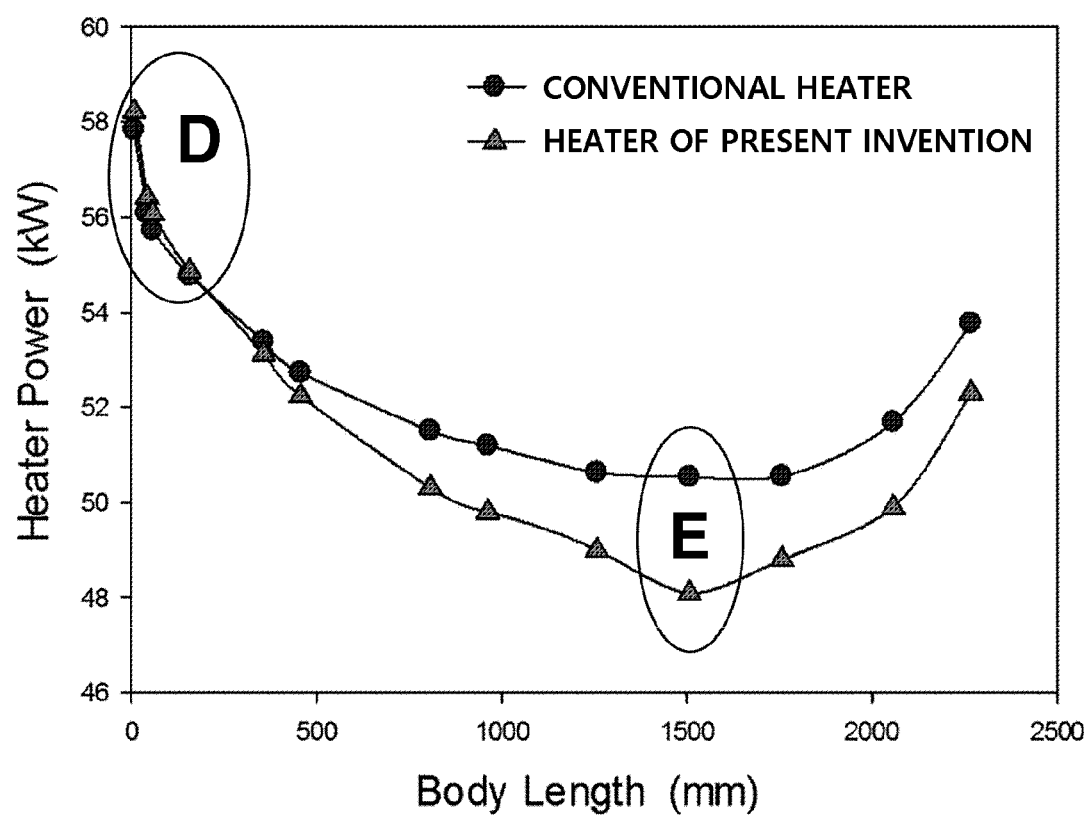
FIG. 8 is test data illustrating energy savings for the heater according to the embodiment of the present invention and the conventional heater.

FIG. 8 is test data illustrating energy savings for the heater according to the embodiment of the present invention and the conventional heater. In this case, a circle is the heater according to the conventional art, and a triangle is a result from the heater according to the embodiment of the present invention.

Referring to FIG. 8, part D is a part in which initial heat quantity of the body part increases. Although the heat quantity of the heater according to the embodiment of the present invention is slightly greater than that of the conventional heater, the heat quantity of the heater according to the embodiment of the present invention may sharply decrease from the 400 mm (part E) in comparison with the conventional heater.

Accordingly, the heater according to the embodiment of the present invention may have a greater energy saving effect than the conventional heater.

According to the above-description and the test data, since the heat increasing part is formed at the upper side of the body part so that the heat may be concentrated at the sidewall of the crucible, the oxygen generation amount in the crucible may be significantly reduced.

Further, since the oxygen generation amount in the crucible is reduced, the ingot may grow without including impurities.

In addition, since the insulation part is installed at the lower end portion of the body part to prevent the discharge of the heat from the lower side of the crucible to the outside, the heat in the crucible may easily move in the upward direction and heat consumption may be reduced.

Although one embodiment of the present invention is described above, the spirit of the present invention is not limited to the embodiment shown in the description, and although those skilled in the art may provide other embodiments due to additions, changes, or removal of the components within the scope of the same spirit of the present invention, such embodiments and the above embodiments are also included in the scope of the spirit of the present invention.

The invention claimed is:

1. A heater for an ingot growing apparatus disposed at the outside of a crucible to heat the crucible, comprising:
   a body part including a flow path through which a heat source configured to generate heat which heats the crucible flows; and
   a heat increasing part formed to be inwardly cut at a predetermined depth along a circumferential direction at an upper side of the body part,
   wherein a portion of the body part at which the heat increasing part is formed has a thickness (d3) smaller than a thickness (d2) of the other portion of the body part and thus the heat is intensively generated at the heat increasing part, and
   wherein a plurality of insulation parts configured to prevent discharge of heat from the crucible to the outside inwardly extend from a lower end portion of the body part.

2. The heater of claim 1, wherein a depth (d1) of the heat increasing part is formed to be 10 to 20% of the thickness (d2) of the body part.

3. The heater of claim 1, wherein a height of the heat increasing part is formed to be 90 to 100 mm.

4. The heater of claim 1, wherein the heat increasing part is spaced 100 to 120 mm apart from an upper end of the body part at and formed at the periphery of the body part.

5. The heater of claim 1, wherein:
   the body part includes a plurality of first slits configured to downwardly extend from an upper end of the body part and a plurality of second slits configured to upwardly extend from a lower end of the body part; and
   the flow path is formed by alternating the plurality of first slits and the plurality of second slits at a predetermined interval.

6. The heater of claim 5, wherein a height (h1) which is from one end of the first slit to a lower end of the body part is formed to be greater than a height (h2) which is from one end of the second slit to an upper end of the body part to reduce generation of the heat.

7. The heater of claim 5, wherein a height (h3) of a portion in which the first slit and the second slit overlap each other corresponds to a height of a sidewall of the crucible.

8. The heater of claim 1, wherein the insulation parts are screw-coupled to the lower end portion of the body part.

9. The heater of claim 1, wherein:
   one side of each of the insulation parts is formed to have a thickness of 20 mm to be coupled to the lower end portion of the body part; and the other side of each of the insulation parts is formed to have a thickness of 10 mm.

\* \* \* \* \*